United States Patent
Ye

(10) Patent No.: US 11,500,500 B2
(45) Date of Patent: Nov. 15, 2022

(54) TOUCH COMPONENT AND TOUCH DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: Wuhan China Star Optoelectronics Semiconductor Display Technology Co., LTD., Hubei (CN)

( * ) Notice: Subject to any disclaimer, the term of this patent is extended or adjusted under 35 U.S.C. 154(b) by 0 days.

(21) Appl. No.: 17/251,794

(22) PCT Filed: Jul. 29, 2020

(86) PCT No.: PCT/CN2020/105507
§ 371 (c)(1),
(2) Date: Dec. 12, 2020

(87) PCT Pub. No.: WO2022/000671
PCT Pub. Date: Jan. 6, 2022

(65) Prior Publication Data
US 2021/0405820 A1     Dec. 30, 2021

(30) Foreign Application Priority Data
Jun. 28, 2020   (CN) .......................... 202010597616.7

(51) Int. Cl.
*G06F 3/044*     (2006.01)
*H01L 27/32*     (2006.01)

(52) U.S. Cl.
CPC .......... *G06F 3/0446* (2019.05); *H01L 27/323* (2013.01); *G06F 2203/04111* (2013.01)

(58) Field of Classification Search
CPC combination set(s) only.
See application file for complete search history.

(56) References Cited

U.S. PATENT DOCUMENTS

| | | | |
|---|---|---|---|
| 2018/0224968 A1* | 8/2018 | Church | ................ G06F 3/0448 |
| 2020/0183518 A1* | 6/2020 | Na | ........................ G06F 3/0412 |

FOREIGN PATENT DOCUMENTS

| | | |
|---|---|---|
| CN | 103279238 A | 9/2013 |
| CN | 107179851 A | 9/2017 |
| CN | 108196736 A | 6/2018 |
| CN | 108710447 A | 10/2018 |

OTHER PUBLICATIONS

International Search Report in International application No. PCT/CN2020/105507,dated Mar. 15, 2021.
Written Opinion of the International Search Authority in International application No. PCT/CN2020/105507,dated Mar. 15, 2021.

* cited by examiner

*Primary Examiner* — Deeprose Subedi
(74) *Attorney, Agent, or Firm* — PV IP PC; Wei Te Chung; Ude Lu

(57) ABSTRACT

A touch component and a touch display device are provided. At least one of a first electrode or a second electrode is provided with a hollow portion, thereby reducing a parasitic capacitance formed between at least one of the first electrode or the second electrode and a cathode of an organic light emitting diode array layer.

16 Claims, 9 Drawing Sheets

TOUCH COMPONENT AND TOUCH DISPLAY DEVICE

RELATED APPLICATIONS

This application is a Notional Phase of PCT Patent Application No. PCT/CN2020/105507 having international filing date of Jul. 29, 2020, which claims the benefit of priority of Chinese Patent Application No. 202010597616.7 filed on Jun. 28, 2020. The contents of the above applications are all incorporated by reference as if fully set forth herein in their entirety.

FIELD OF INVENTION

The present invention relates to the field of touch technologies, and in particular, to a touch component and a touch display device.

BACKGROUND OF INVENTION

Capacitive touch screens are widely used in various electronic interactive scene devices due to their high durability, long life, and support for multi-touch functions. The capacitive touch screens detect specific positions of finger touches by detecting changes of capacitances at positions of the finger touches.

At present, for flexible active matrix organic light emitting diode touch external displays, touch electrode patterns usually need to be directly formed on an upper surface of a thin film encapsulation (TFE) layer. However, due to the thin encapsulation layer (usually thickness<10 um), a distance between a touch electrode of an external structure and a cathode of the active matrix organic light emitting diode is short, resulting in a larger parasitic capacitance between a driving electrode TX/sensing electrode RX and the cathode of the touch electrode. An RC delay of the driving electrode TX/sensing electrode RX channel at a far end of a large-size touch screen is greater, resulting in a significant decrease in a sensing frequency of a driving signal waveform of the driving electrode TX/sensing electrode RX. This leads to a decrease in key performance such as a touch report rate.

Therefore, it is necessary to propose a technical solution to solve the problem that a large parasitic capacitance between the driving electrode TX/sensing electrode RX of the touch electrode and the cathode causes low touch report rate.

TECHNICAL PROBLEM

An objective of the present invention is to provide a touch component and a touch display device to solve a problem of large parasitic capacitance between a touch electrode and a cathode, improve a mutual capacitance between a driving electrode and a sensing electrode of the touch electrode at the same time, and improve a touch report rate of the touch display device by reducing a parasitic capacitance and increasing the mutual capacitance.

TECHNICAL SOLUTION

In order to achieve the above objective, the present invention provides a touch component. The touch component comprises a touch layer, wherein the touch layer comprises a plurality of touch units, and each of the touch units comprises:

a first electrode disposed along a first direction, wherein the first electrode comprises a first trunk electrode extending in the first direction and at least one first branch electrode extending from the first trunk electrode; and a second electrode disposed along a second direction, wherein the second electrode is electrically insulated from the first electrode, the second electrode comprises a second trunk electrode extending along the second direction and at least one second branch electrode extending from the second trunk electrode, and at least part of the first branch electrode is crossed with at least part of the second branch electrode;

wherein at least one of the first electrode or the second electrode is provided with a hollow portion.

In the above touch component, the first branch electrode is provided with the hollow portion, and/or the second branch electrode is provided with the hollow portion, and/or the first trunk electrode is provided with the hollow portion, and/or the second trunk electrode is provided with the hollow portion.

In the above touch component, the first trunk electrode is provided with the hollow portion, the first branch electrode is provided with the hollow portion, the second branch electrode is provided with the hollow portion, and the second trunk electrode is provided with the hollow portion.

In the above touch component, each of the first trunk electrodes is provided with a plurality of the hollow portions disposed at intervals and is distributed along the first direction, a first trunk non-hollowed portion is provided between two adjacent hollow portions on a same first trunk electrode, and the first branch electrode extends from the first trunk non-hollowed portion of the first trunk electrode; and/or each of the second trunk electrodes is provided with a plurality of the hollow portions disposed at intervals and is distributed along the second direction, a second trunk non-hollowed portion is provided between two adjacent hollow portions on a same second trunk electrode, and the second branch electrode extends from the second trunk non-hollowed portion of the second trunk electrode.

In the above touch component, each of the first branch electrodes comprises at least one first branch widening portion, and each of the second branch electrodes comprises at least one second branch widening portion, and the first branch widening portion at each of the first branch electrodes and the second branch widening portion at the second branch electrode adjacent to the first branch electrode engage with each other.

In the above touch component, the touch unit further comprises a floating electrode, a portion of the floating electrode is disposed between the first branch electrode and the second branch electrode adjacent to the first branch electrode, the floating electrode is electrically insulated from the first branch electrode, and the floating electrode is electrically insulated from the second branch electrode.

In the above touch component, each of the first branch electrodes comprises two opposite and connected first branch strips and the hollow portion disposed between the two opposite first branch strips; and each of the second branch electrodes comprises two opposite and connected second branch strips and the hollow portion disposed between the two opposite second branch strips.

In the above touch component, one of the first trunk electrode or the second trunk electrode comprises a trunk non-widening portion and a trunk widening portion connected to the trunk non-widening portion, a width of the trunk widening portion is greater than a width of the trunk non-widening portion, and the trunk widening portion is provided near an intersection of the first trunk electrode and the second trunk electrode.

In the above touch component, the touch unit further comprises a plurality of floating electrodes, the plurality of floating electrodes are electrically insulated from the first electrode and the second electrode, and a portion of the floating electrodes is disposed in the hollow portion.

In the above touch component, a portion of the floating electrodes is disposed between the first electrode and the second electrode.

In the above touch component, in each of the touch units, a percentage of a ratio of an area of the floating electrode to an area of the touch unit is greater than or equal to 30% and less than or equal to 90%.

In the above touch component, in each of the touch units, an absolute value of a difference between a percentage of a ratio of an area of the first electrode to an area of the touch unit and a percentage of a ratio of an area of the second electrode to an area of the touch unit is less than a preset percentage.

In the above touch component, in each of the touch units, the area of the first electrode is equal to the area of the second electrode.

In the above touch component, the first electrode and the second electrode are located on a same conductive layer, the first electrode in each of the touch units is electrically connected by a bridge wire, and the second electrode in each of the touch units is continuously formed.

In the above touch component, the first electrode further comprises a first vertical trunk electrode, the first vertical trunk electrode and the first trunk electrode are perpendicular to each other, and the first vertical trunk electrode is parallel to the second direction, and the second electrode further comprises a second vertical trunk electrode, the second vertical trunk electrode and the second trunk electrode are perpendicular to each other, the second vertical trunk electrode is parallel to the first direction, and the first direction is perpendicular to the second direction.

A touch display device comprises the above touch component and a display panel, wherein the display panel comprises a plurality of sub-pixels, and the touch component is located on a light emitting side of the display panel.

In the above touch display device, each of the first branch electrodes surrounds at least two of the sub-pixels in a width direction of the first branch electrode, and each of the second branch electrodes surrounds at least two of the sub-pixels in a width direction of the second branch electrode; and both the first electrode and the second electrode are composed of a metal grid.

In the above touch display device, the touch layer further comprises a plurality of floating electrodes, a portion of the floating electrodes is disposed between the first electrode and the second electrode, a number of the sub-pixels surrounded by the floating electrodes disposed between the first electrode and the second electrode in a width direction of the floating electrodes is less than or equal to 4 and greater than 0, and the floating electrodes are composed of a metal grid.

In the above touch display device, the display panel comprises an organic light emitting diode array layer and a packaging layer, and the packaging layer is located between the organic light emitting diode array layer and the touch component.

Beneficial Effect

The present invention provides a touch component and a touch display device. The touch component comprises a touch layer, wherein the touch layer comprises a plurality of touch units, and each of the touch units comprises a first electrode disposed along a first direction, wherein the first electrode comprises a first trunk electrode extending in the first direction and at least one first branch electrode extending from the first trunk electrode; and a second electrode disposed along a second direction, wherein the second electrode is electrically insulated from the first electrode, the second electrode comprises a second trunk electrode extending along the second direction and at least one second branch electrode extending from the second trunk electrode, and at least part of the first branch electrode is crossed with at least part of the second branch electrode; wherein at least one of the first electrode or the second electrode is provided with a hollow portion. By providing at least one of the first electrode or the second electrode with the hollow portion, the area of at least one of the first electrode or the second electrode is reduced, a parasitic capacitance formed between at least one of the first electrode or the second electrode and the cathode of the organic light emitting diode array layer is reduced, and an insufficient charging of the touch unit due to a delay of a touch signal caused by the parasitic capacitance is reduced. In addition, at least part of the first branch electrode is crossed with at least part of the second branch electrode to increase a mutual capacitance between the first electrode and the second electrode, increase the mutual capacitance to reduce the parasitic capacitance, and prevent a touch induction frequency from decreasing and affecting key touch performance indicators such as a report rate.

Figure 1:
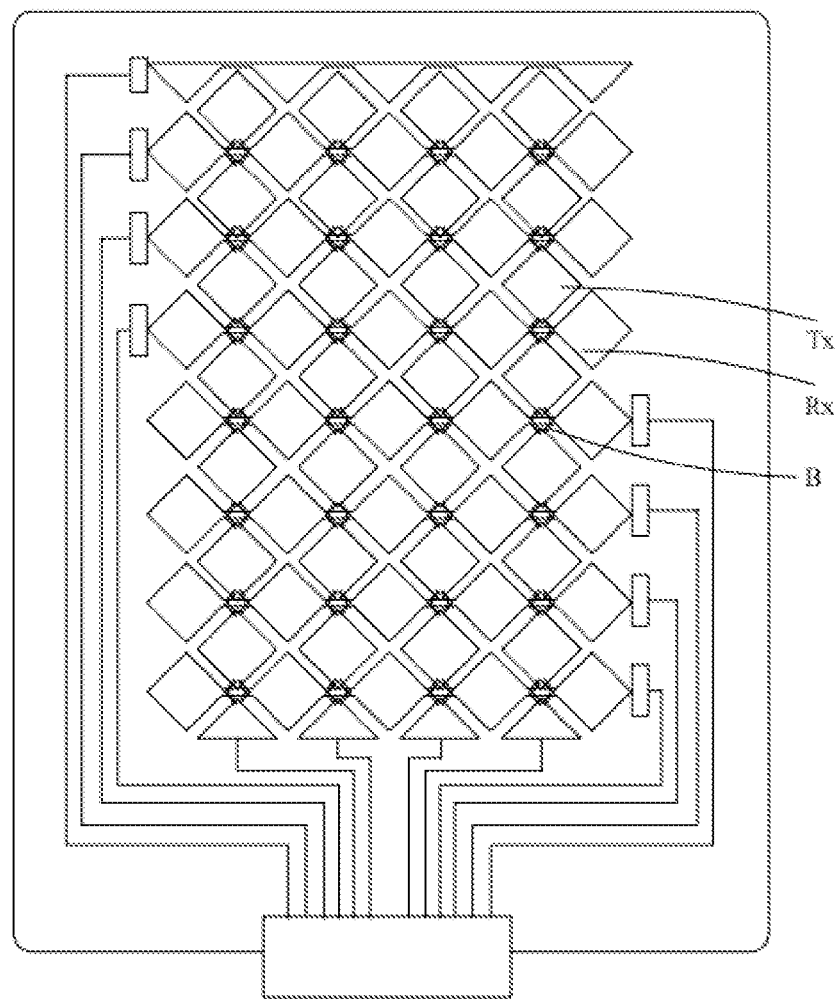
FIG. 1 is a schematic view of a traditional touch screen using 1T1R drive architecture.

Reference numerals are shown as follows:

100: touch display device; 10: substrate; 20: thin film transistor array layer; 30: organic light emitting diode array layer; 40: thin film packing layer; 50: touch layer; 60: polarizer; 70: protective cover; 50: touch layer;

501: touch unit; 5011: first electrode; 50111: first trunk electrode; 501111: first trunk strip; 501111a; non-widening section; 501111b: widening section; 50111a: first trunk hollow portion; 50111b: first trunk non-hollowed portion; 50112: first branch electrode; 501121: first branch strip; 501121a: first branch strip widening portion; 50112a: first branch hollow portion; 501122: first branch widening portion; 501123: first branch non-widening portion; 50113: first vertical trunk electrode; 5012: second electrode; 50121: second trunk electrode; 501211: second trunk electrode strip; 50121a: second trunk hollow portion; 50121b: second trunk non-hollowed portion; 50122: second branch electrode; 501221: second branch strip; 501221a: second branch strip widening portion; 50122a: second branch hollow portion; 501222: second branch widening portion; 501223: second branch non-widening portion; 50123: second vertical trunk electrode; 502: first lead; 503: second lead; 504: bridge wire; 505: floating electrode.

DETAILED DESCRIPTION OF PREFERRED EMBODIMENTS

The following will clearly and completely describe the technical solutions in the embodiments of the present invention with reference to the drawings in the embodiments of the present invention. Obviously, the described embodiments are only a part of the embodiments of the present invention, rather than all the embodiments. Based on the embodiments in the present invention, all other embodiments obtained by those skilled in the art without creative work are within the protection scope of the present invention.

Figure 2:
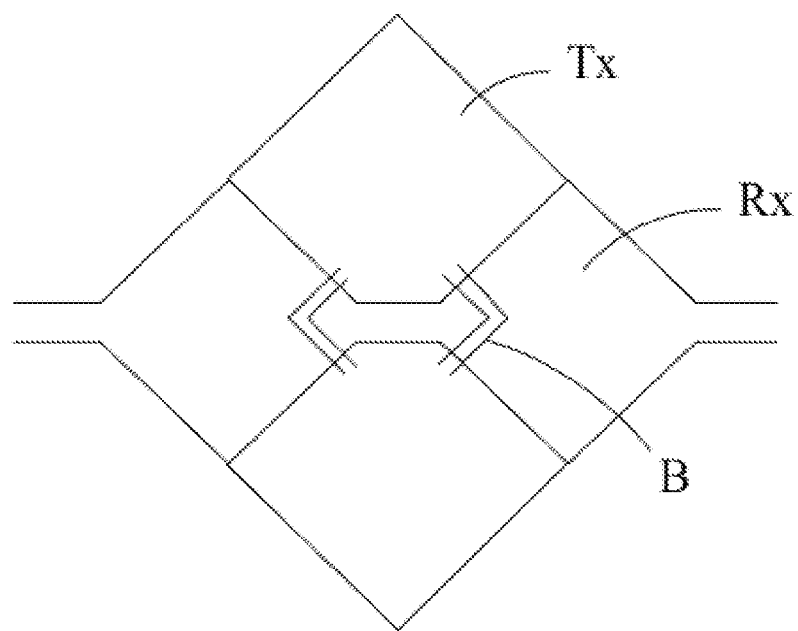
FIG. 2 is a schematic view of a diamond-shaped touch electrode shown in FIG. 1.

Please refer to FIG. 1 and FIG. 2. FIG. 1 is a schematic view of a traditional touch screen using 1T1R drive architecture, and FIG. 2 is a schematic view of a diamond-shaped touch electrode shown in FIG. 1. The traditional touch screen comprises mutually capacitive touch electrodes arranged in an array. Mutual capacitance touch electrodes comprise driving electrodes Tx and sensing electrodes Rx, and the driving electrodes Tx and sensing electrodes Rx are arranged in a same layer and insulated from each other. The driving electrodes Tx are arranged in an array along a row direction and a column direction and the driving electrodes Tx located in a same column are electrically connected by a bridge wire B. The bridge wire B and the driving electrode Tx are on different layers. The sensing electrodes Rx are arranged in an array along a row direction and a column direction and the sensing electrodes Rx in a same row are turned on. The driving electrodes Tx of the same column are connected to a first wire, and a touch chip inputs a driving scan signal to the driving electrodes Tx of each column through the first wire. The sensing electrode Rx in the same row is connected to a second wire, and a driving chip outputs a sensing signal to the driving chip through the second wire.

Most of the driving electrodes Tx are diamond-shaped, and a small portion of the driving electrodes Tx on edges are isosceles triangles. Most of the sensing electrodes Rx are diamond-shaped, and a small portion of the sensing electrodes Rx on the edges are isosceles triangles. Each driving electrode Tx is composed of a plurality of metal grids, and each sensing electrode Rx is composed of a plurality of metal grids.

A traditional touch display device comprises an organic light emitting diode array layer, a thin film packaging layer, and a touch layer which are sequentially stacked. The organic light emitting diode array layer comprises a common cathode, and a touch layer uses a touch structure shown in FIG. 1. A thickness of the thin film packing layer is relatively thin, and a parasitic capacitance is formed between the driving electrode Tx and the sensing electrode Rx and the common cathode of the organic light emitting diode array layer. The parasitic capacitance causes the drive electrode Tx far away from an output signal end of the driving chip to have a large RC delay due to the parasitic capacitance, which causes a significant decrease in a sensing frequency of a driving signal waveform of the driving electrode TX/sensing electrode RX. This leads to a decrease in key performance such as a touch report rate. In addition, since the driving electrode Tx and the sensing electrode Rx are both formed by hollowed-out metal grids, actual effective electrode areas of the driving electrode Tx and the sensing electrode Rx are relatively small. A mutual capacitance between the driving electrode Tx and the sensing electrode Rx is very small, resulting in a smaller capacitance change caused by a finger touch, which is not easy to be detected by the touch chip.

In view of problems existing in the traditional touch display device, the present invention provides a touch display device designed to solve the problem of large parasitic capacitance due to short distance between the touch electrode of the touch display device and the common cathode of the organic light emitting diode array layer, and to improve the mutual capacitive induction between the driving electrode Tx and the sensing electrode Rx.

In the present invention, a touch display device comprises a display panel and a touch component. The touch component comprises a touch layer. The touch component can be externally hung outside the display panel, or it can be built within the display panel. The display panel can be a liquid crystal display panel or an organic light emitting diode display panel. The display panel comprises a plurality of sub-pixels, and the touch component is located on a light emitting side of the display panel. To facilitate the description of a technical solution of the present invention, the following is an example of a display panel that is an organic light emitting diode display panel.

Figure 3:
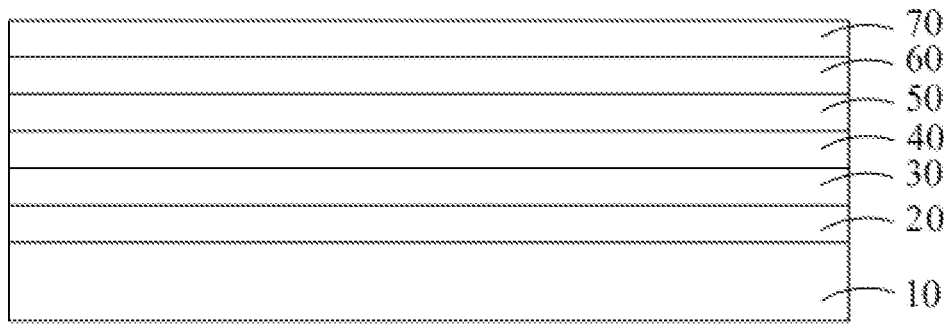
FIG. 3 is a schematic view of a touch display device according to an embodiment of the present invention.

As shown in FIG. 3, which is a schematic view of the touch display device according to an embodiment of the present invention, the touch display device 100 comprises a substrate 10, a thin film transistor array layer 20, an organic light emitting diode array layer 30, a packing layer 40, a touch layer 50, a polarizer 60, and a protective cover 70, which are sequentially stacked. The substrate 10, the thin film transistor array layer 20, the organic light emitting diode array layer 30, and the packaging layer 40 constitute the display panel.

The substrate 10 is a flexible substrate, and the substrate 10 serves as a carrier to provide a supporting surface for the thin film transistor array layer 20 and other film layers. The base 10 may also be a glass substrate, etc.

The thin film transistor array layer 20 comprises a plurality of thin film transistors arranged in an array. The thin film transistors are configured to control a working state of the organic light emitting diodes in the organic light emitting diode array layer 30. The thin film transistor may be at least one of an amorphous silicon thin film transistor, a polysilicon thin film transistor, or a metal oxide thin film transistor.

The organic light-emitting diode array layer 30 comprises a plurality of organic light-emitting diodes arranged in an array. The plurality of organic light emitting diodes arranged in the array comprises a plurality of independent anodes, an organic light emitting unit corresponding to each anode, and a common cathode. The plurality of organic light emitting diodes arranged in the array constitute a plurality of sub-pixels of an organic light-emitting diode display panel, and one organic light-emitting diode corresponds to one sub-pixel. The sub-pixels comprise red sub-pixels, blue sub-pixels, and green sub-pixels. The sub-pixels are square, diamond, or rectangle. A size of the sub-pixels is tens of microns, such as 50 microns or 70 microns.

The packaging layer 40 is a thin film packaging layer, which comprises two inorganic layers and an organic layer disposed between the two inorganic layers. The inorganic layer is formed by chemical sputtering deposition, and the organic layer is formed by coating or inkjet printing, etc. A thickness of the film packing layer is 3 microns to 10 microns, such as 5 microns, 6 microns, or 8 microns. A forming material of the inorganic layer is selected from silicon nitride or silicon oxide, and a forming material of the organic layer is selected from polyimide, etc. The packaging layer 40 can also be a glass packaging cover.

The polarizer 60 is configured to improve a transmittance of ambient light in the touch display device, and to improve a contrast of the touch display device during display. The protective cover 70 is configured to protect the polarizer 60 and other film layers. The protective cover 70 is a transparent polyimide layer.

Figure 4:
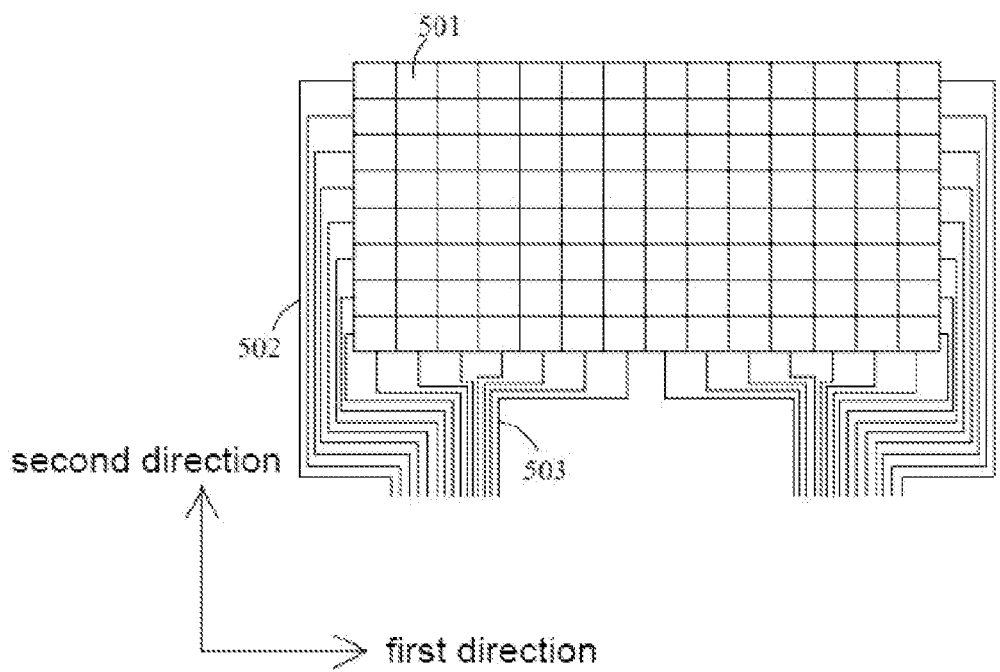
FIG. 4 is a schematic view of a driving structure of a touch layer of the touch display device according to the embodiment of the present invention.
Figure 5:
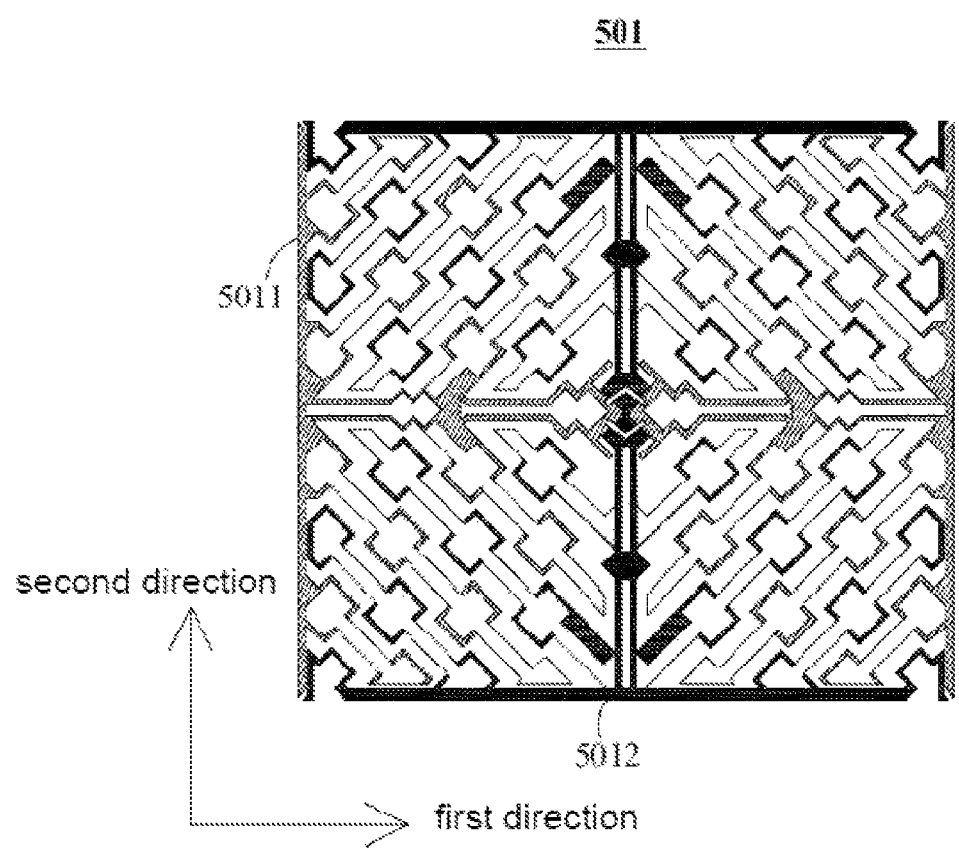
FIG. 5 is a first schematic view of a touch unit shown in FIG. 4.

Please refer to FIG. 4 and FIG. 5. FIG. 4 is a schematic view of a driving structure of the touch layer of the touch display device according to the embodiment of the present invention. FIG. 5 is a first schematic view of a touch unit shown in FIG. 4. The touch layer 50 comprises a plurality of touch units 501 disposed in an array, a plurality of first leads 502, and a plurality of second leads 503. The touch display device further comprises a touch chip (not shown).

A size of the touch layer 50 along a first direction is greater than a size of the touch layer 50 along a second direction, and the first direction and the second direction are perpendicular. The touch units 501 are arranged in an array along the first direction and the second direction. A shape of each touch unit 501 is square.

Each touch unit 501 comprises a first electrode 5011 disposed along the first direction and a second electrode 5012 disposed along the second direction. A plurality of the first electrodes 5011 in a same row are disposed along the first direction to form a first electrode channel, and a plurality of the first electrode channels are disposed in the second direction. The plurality of first electrodes 5011 in the same row are electrically connected with each other. A plurality of the second electrodes 5012 in a same column are disposed along the second direction to form a second electrode channel, and a plurality of the second electrode channels are disposed in the first direction. The plurality of second electrodes 5012 in the same column are electrically connected with each other. A number of the first electrode channels is less than a number of the second electrode channels, and a number of the first electrodes on each first electrode channel is greater than a number of the second electrodes on each second electrode channel. An impedance of each first electrode channel is greater than an impedance of each second electrode channel.

Opposite ends of each first electrode channel are respectively connected to the first lead 502, and one end of each second electrode channel is connected to the second lead 503. Specifically, for each first electrode channel, one first lead 502 is connected to the first electrode 5011 at one end of the first electrode channel, and another first lead 502 is connected to the first electrode 5011 at another end of the first electrode channel. For each second electrode channel, the second lead 503 is connected to the second electrode 5012 at one end of the second electrode channel. Both the first lead 502 and the second lead 503 are connected to the touch chip. The touch chip outputs a driving scan signal to each first lead 502 and receives a sensing signal output by each second lead 503. The touch layer of the embodiment uses a 2T1R architecture. Since each first electrode channel uses bilateral driving, a load that the touch chip needs to bear to drive each first electrode channel is reduced, which can effectively increase an induction frequency and a touch report rate.

In the embodiment, the first electrode 5011 is a driving electrode, and the second electrode 5012 is a sensing electrode. In other embodiments, the first electrode 5011 may also be a sensing electrode, and the second electrode 5012 may also be a driving electrode.

Figure 6:
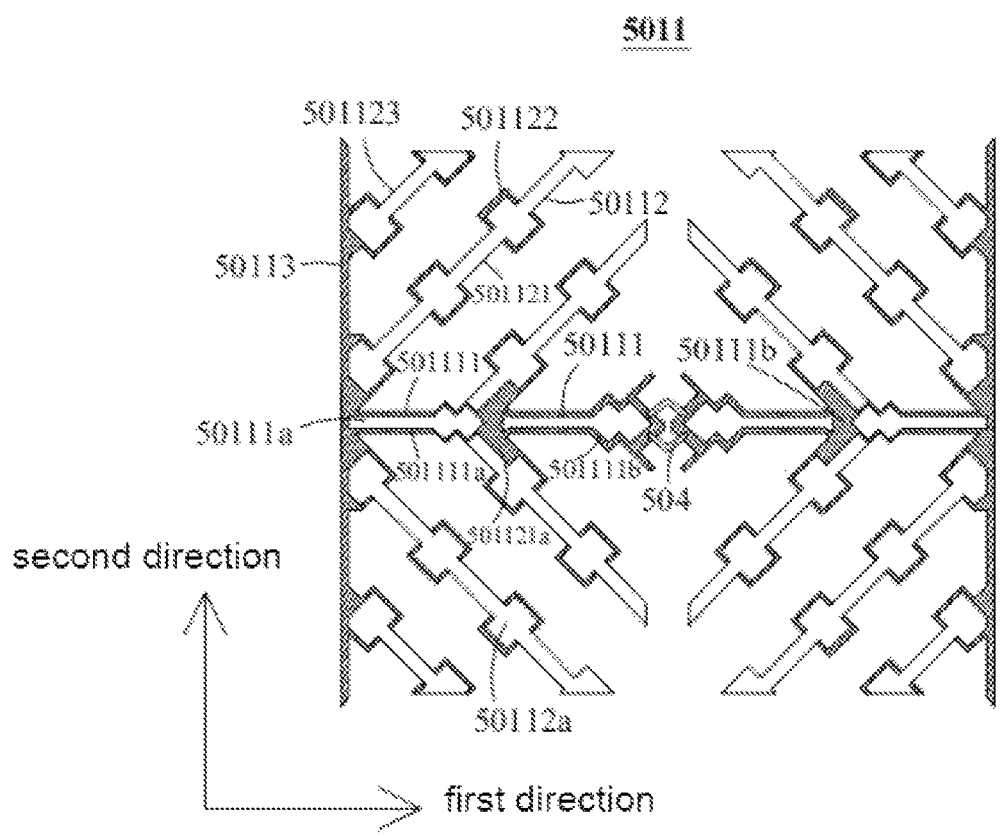
FIG. 6 is a schematic view of a first electrode in the touch unit shown in FIG. 5.

As shown in FIG. 6, which is a schematic view of the first electrode in the touch unit shown in FIG. 5, the first electrode 5011 comprises a first trunk electrode 50111, a first vertical trunk electrode 50113, and a plurality of first branch electrodes 50112. Two adjacent first electrodes 5011 in the same touch unit 501 are electrically connected with each other in the first direction by a bridge wire 504.

The first trunk electrode 50111 extends along the first direction, and at least one first branch electrode 50112 extends from the first trunk electrode 50111. A width of the first trunk electrode 50111 is greater than a width of the first branch electrode 50112. The first vertical trunk electrode 50113 and the first trunk electrode 50111 are perpendicular to each other. The first trunk electrode 50111 is disposed in the middle of the first vertical trunk electrode 50113, and the first vertical trunk electrode 50113 is parallel to the second direction. At least one first branch electrode 50112 extends from the first vertical trunk electrode 50113. A plurality of the first branch electrodes 50112 are symmetrically disposed on the first trunk electrode 50111 and the first vertical trunk electrode 50113 of the same touch unit 501 with the first trunk electrode 50111 as a symmetry axis. In the same touch unit 501, a plurality of the first branch electrodes 50112 extend in a direction close to the second trunk electrode 50121.

An angle between the first branch electrode 50112 extending from the first trunk electrode 50111 and the first trunk electrode 50111 is greater than 0 degrees and less than 90 degrees, for example, 30 degrees, 40 degrees, 50 degrees, 60 degrees, or 80 degrees. An angle between the first branch electrode 50112 extending from the first vertical trunk electrode 50113 and the first vertical trunk electrode 50113 is greater than 0 degrees and less than 90 degrees, such as 30 degrees, 40 degrees, 50 degrees, 60 degrees or 80 degrees.

Specifically, in the embodiment, the angle between the first branch electrode 50112 extending from the first trunk electrode 50111 and the first trunk electrode 50111 is 45 degrees. The angle between the first branch electrode 50112 extending from the first vertical trunk electrode 50113 and the first vertical trunk electrode 50113 is 45 degrees.

Figure 7:
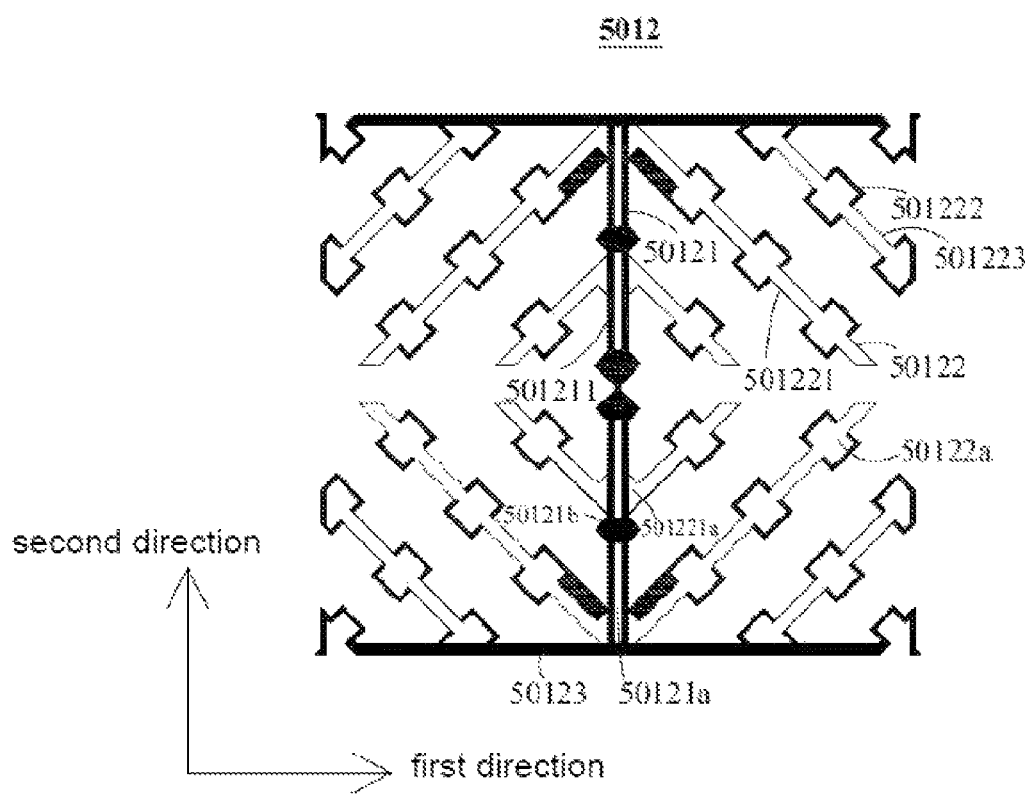
FIG. 7 is a schematic view of a second electrode in the touch unit shown in FIG. 5.

As shown in FIG. 7, which is a schematic view of the second electrode in the touch unit shown in FIG. 5, the second electrode 5012 comprises a second trunk electrode 50121, a second vertical trunk electrode 50123, and a plurality of second branch electrodes 50122.

The second trunk electrode 50121 extends along the second direction, and at least one second branch electrode 50122 is extended from the second trunk electrode 50121. A width of the second trunk electrode 50121 is greater than a width of the second branch electrode 50122. The second vertical trunk electrode 50123 is perpendicular to the second trunk electrode 50121, and the second vertical trunk electrode 50123 is parallel to the first direction. The second trunk electrode 50121 is disposed in a middle of the second vertical trunk electrode 50123. At least one second branch electrode 50122 extends from the second vertical trunk electrode 50123. A plurality of the second branch electrodes 50122 are symmetrically disposed on the second trunk electrode 50121 and the second vertical trunk electrode 50123 of the same touch unit with the second trunk electrode 50121 as a symmetry axis. In the same touch unit 501, the plurality of second branch electrodes 50122 extend in a direction close to the first trunk electrode 50111.

An angle between the second branch electrode 50122 extending from the second trunk electrode 50121 and the second trunk electrode 50121 is greater than 0 degrees and less than 90 degrees, such as 30 degrees, 40 degrees, 50 degrees, 60 degrees, or 80 degrees. An angle between the second branch electrode 50122 extending from the second vertical trunk electrode 50123 and the second vertical trunk electrode 50123 is greater than 0 degrees and less than 90 degrees, such as 30 degrees, 40 degrees, 50 degrees, 60 degrees or 80 degrees.

Specifically, the angle between the second branch electrode 50122 extending from the second trunk electrode 50121 and the second trunk electrode 50121 is 45 degrees. The angle between the second branch electrode 50122 extending from the second vertical trunk electrode 50123 and the second vertical trunk electrode 50123 is 45 degrees.

As shown in FIGS. 5-7, each first electrode 5011 in the same touch unit 501 comprises two first sub-electrodes disposed symmetrically with respect to the second trunk electrode 50121, and the two first sub-electrodes are connected by bridge wire 504. The bridge wire 504 and the first electrode 5011 are on different layers. Each first sub-electrode comprises a first trunk electrode 50111, a first branch electrode 50112 extending from the first trunk electrode 50111, a first branch electrode 50112 extending from one side of the first vertical trunk electrode 50113, and a first vertical trunk electrode 50113. Each second electrode 5012 in the same touch unit 501 comprises two second sub-electrodes disposed symmetrically with respect to the first trunk electrode 50111. Each second sub-electrode comprises a second trunk electrode 50121, a second branch electrode 50122 extending from the second trunk electrode 50121, a second branch electrode 50122 extending from one side of the second vertical trunk electrode 50123, and a second vertical trunk electrode 50123. The two second sub-electrodes in the same touch unit 501 are connected by a connecting portion, and the connecting portion and the second electrode 5012 are provided on a same layer. Two adjacent first sub-electrodes connected by the bridge wire 504 in the first direction and two adjacent second sub-electrodes connected by the connecting portion in the second direction form the touch unit 501.

In each touch unit, each first branch electrode 50112 is parallel to the second branch electrode 50122 adjacent to the first branch electrode 50112, and at least part of the first branch electrode 50112 and at least part of the second branch electrode 50122 are disposed to cross each other to increase a mutual capacitance between the first branch electrode 50112 and the second branch electrode 50122, thereby increasing the mutual capacitance between the first electrode 5011 and the second electrode 5012 in each touch unit.

Specifically, in the same touch unit 501, in a region enclosed by the first trunk electrode 50111, ½ of the first vertical trunk electrode 50113, the second trunk electrode 50121, and ½ of the second vertical trunk electrode 50123, the first branch electrodes 50112 and the second branch electrodes 50122 are staggered and arranged in parallel. The second branch electrode 50122 is provided between two adjacent first branch electrodes 50112, and the first branch electrode 50112 is provided between two adjacent second branch electrodes 50122.

At least one of the first electrode 5011 or the second electrode 5012 is provided with a hollow portion. By hollowing out at least one of the first electrode 5011 or the second electrode 5012 to reduce an area of at least one of the first electrode 5011 or the second electrode 5012, which reducing a parasitic capacitance formed between at least one of the first electrode 5011 or the second electrode 5012 and the cathode of the organic light emitting diode array layer, reducing an RC delay in the first electrode channel and the second electrode channel that are far away from a driving signal source due to the parasitic capacitance, and prevent causing an induced frequency of a driving signal transmitted through the first electrode 5011 and the second electrode 5012 to drop significantly, so as to prevent key performance degradation issues such as a touch report rate. Cooperate with at least part of the first branch electrodes and at least part of the second branch electrodes alternately disposed to increase the mutual capacitance and improve the touch report rate.

In the embodiment, the first trunk electrode 50111 is provided with a first trunk hollow portion 50111a, and/or, the second trunk electrode 50121 is provided with a second trunk hollow portion 50121a, and/or, the first branch electrode 50112 is provided with a first branch hollow portion 50112a, and/or, the second branch electrode 50122 is provided with a second branch hollow portion 50122a. By reducing an area of the first trunk electrode 50111 and/or the second trunk electrode 50121, the parasitic capacitance between a trunk road of the first electrode 5011 and/or the second electrode 5012 and the cathode is reduced, and a delay of the parasitic capacitance to touch signals (including drive signals and sensing signals) on the trunk road is improved. In addition, by reducing the area in the first branch electrode 50112 and/or the second branch electrode 50122, the area of the first electrode 5011 and the second electrode 5012 is further reduced, thereby further reducing the parasitic capacitance between the first electrode 5011 and the second electrode 5012 and the cathode.

It should be noted that the first branch electrode 50112 is different from the first trunk electrode 50111. The first trunk electrode 50111 is mainly configured to conduct touch signals, and the first branch electrode 50112 is mainly configured to generate a mutual inductance capacitance with the second branch electrode 50122. Hollowing out the first trunk electrode 50111 will reduce the capacitance between the first trunk electrode 50111 and the common cathode, but also increase the impedance of the first trunk electrode 50111. The second branch electrode 50122 has the same principle as the second trunk electrode 50121 and will not be detailed here.

As shown in FIG. 6 and FIG. 7, the first trunk electrode 50111 is provided with the first trunk hollow portion 50111a, the first branch electrode 50112 is provided with the first branch hollow portion 50112a, the second branch electrode 50122 is provided with the second branch hollow portion 50122a, and the second trunk electrode 50121 is provided with the second trunk hollow portion 50121a.

In the embodiment, each first trunk electrode 50111 is provided with a plurality of the first trunk hollow portions 50111a spaced apart and distributed along the first direction. A first trunk non-hollowed portion 50111b is provided between two adjacent first trunk hollow portions 50111a of the same first trunk electrode 50111, the first branch electrode 50112 is extended from the first trunk non-hollowed portion 50111b of the first trunk electrode 50111, and/or each second trunk electrode 50121 is provided with a plurality of second trunk hollow portions 50121a spaced apart and distributed along the second direction, a second trunk non-hollowed portion 50121*b* is provided between two adjacent second trunk hollow portions 50121*a* on the same second trunk electrode 50121, and the second branch electrode 50121 extends from the second trunk non-hollowed portion 50121*b* of the second trunk electrode 50121.

Specifically, each first trunk electrode 50111 is provided with the plurality of first trunk hollow portions 50111*a* spaced apart and distributed along the first direction. The first trunk non-hollowed portion 50111*b* is provided between two adjacent first trunk hollow portions 50111*a* of the same first trunk electrode 50111. The first branch electrode 50112 is extended from the first trunk non-hollowed portion 50111*b* of the first trunk electrode 50111, and each second trunk electrode 50121 is provided with the plurality of second trunk hollow portions 50121*a* spaced apart and distributed along the second direction. The second trunk non-hollowed portion 50121*b* is provided between two adjacent second trunk hollow portions 50121*a* on the same second trunk electrode 50121. The second branch electrode 50121 extends from the second trunk non-hollowed portion 50121*b* of the second trunk electrode 50121.

Since the first trunk hollow portions 50111*a* on the first trunk electrode 50111 are disposed at intervals, a middle position of the first trunk electrode 50111 is reserved so that a resistance of the first trunk electrode 50111 is completely hollowed out and reduced relative to the middle position of the first trunk electrode 50111. In addition, it is conducive to a conduction between the two opposing first trunk strips that make up the first trunk electrode 50111, so that potentials on the two opposite first trunk strips that make up the first trunk electrode 50111 are the same. The first trunk hollow portions 50111*a* disposed at intervals on the first trunk electrode 50111 are beneficial to the balance between the parasitic capacitance of the first trunk electrode 50111 and the resistance of the first trunk electrode 50111. The second trunk hollow portion 50121*a* on the second trunk electrode 50121 is disposed at intervals in the same way as the first trunk hollow portion 50111*a* on the first trunk electrode 50111 and will not be described in detail here. In addition, the first branch electrode 50112 is extended from the first trunk non-hollowed portion 50111*b* of the first trunk electrode 50111, so that the first branch electrodes 50112 extending from the two opposite first trunk strips 501111 of the first trunk electrode 50111 are electrically connected, and the resistance value where the first trunk electrode 50111 extends from the first branch electrode 50112 is reduced to prevent excessive hollowing in the first trunk electrode 50111, which will increase an impedance of the first electrode channel and affect a touch performance. The second branch electrode 50122 is extended from the second trunk non-hollowed portion 50121*b* of the second trunk electrode 50121 in the same way, which will not be described in detail here. A shape of the first trunk hollow portion 50111*a* is the same as a shape of the first trunk electrode 50111, and a shape of the second trunk hollow portion 50121*a* is the same as a shape of the second trunk electrode 50121. The second trunk hollow portion 50121*a* is rectangular.

In other embodiments, each first trunk electrode 50111 may also be provided with the plurality of first trunk hollow portions 50111*a* spaced apart and distributed along the first direction. The first trunk non-hollowed portion 50111*b* is provided between two adjacent first trunk hollow portions 50111*a* of the same first trunk electrode 50111. The first branch electrode 50112 is extended from the first trunk non-hollowed portion 50111*b* of the first trunk electrode 50111.

In other embodiments, each second trunk electrode 50121 may also be provided with the plurality of second trunk hollow portions 50121*a* disposed at intervals and distributed along the second direction. The second trunk non-hollowed portion 50121*b* is provided between two adjacent second trunk hollow portions 50121*a* on the same second trunk electrode 50121. The second branch electrode 50121 extends from the second trunk non-hollowed portion 50121*b* of the second trunk electrode 50121.

Specifically, as shown in FIG. 6, each first trunk electrode 50111 comprises two opposite and connected first trunk strips 501111, and the first trunk hollow portions 50111*a* disposed between the two opposed first trunk strips 501111 and disposed at intervals. The first trunk non-hollowed portion 50111*b* connects the two opposite first trunk strips 501111. Each first branch electrode 50112 comprises two opposite and connected first branch strips 501121 and a first branch hollow portion 50112*a* disposed between the two opposite first branch strips 501121.

As shown in FIG. 7, each second trunk electrode 50121 comprises two opposite and connected second trunk strips 501211 and second trunk hollow portions 50121*a* disposed between the two second trunk strips 501211 and arranged at intervals. The second trunk non-hollowed portion 50121*b* connects two opposite second trunk strips 501211. Each second branch electrode 50122 comprises two opposite and connected second branch strips 501221 and the second branch hollow portion 50122*a* disposed between the two opposite second branch strips 501221.

A width of the first trunk strip 501111 is greater than a width of the first branch strip 501121, and a width of the second trunk strip 501211 is greater than a width of the second branch strip 501221.

In the embodiment, both the first electrode 5011 and the second electrode 5012 are composed of metal grid. The first trunk strip 501111 surrounds at least two sub-pixels in a width direction of the first trunk strip 501111, for example, surrounds 2 sub-pixels, 3 sub-pixels, 2.5 sub-pixels, etc.; the second trunk strip 501211 surrounds at least two sub-pixels in a width direction of the second trunk strip 501211, for example, surrounds 2 sub-pixels, 3 sub-pixels, 2.5 sub-pixels, etc., to ensure that the resistance of the first trunk electrode 50111 and the second trunk electrode 50121 meets a requirement.

The first branch electrode 50112 surrounds at least two sub-pixels in a width direction of the first branch electrode 50112. Each second branch electrode 50122 surrounds at least two sub-pixels in a width direction of the second branch electrode 50122. A number of the sub-pixels surrounded by each first branch strip 501121 in a width direction of the first branch strip 501121 is greater than 0 (for example, 0.5 sub-pixel or 1 sub-pixel), and a number of the sub-pixels surrounded by each second branch strip 501211 in a width direction of the second branch strip 501211 is greater than 0 (for example, 0.5 sub-pixel or 1 sub-pixel) to effectively ensure an interactive capacitance between the first electrode 5011 and the second electrode 5012 and a proportion of the interactive capacitance caused by touch.

Figure 8:
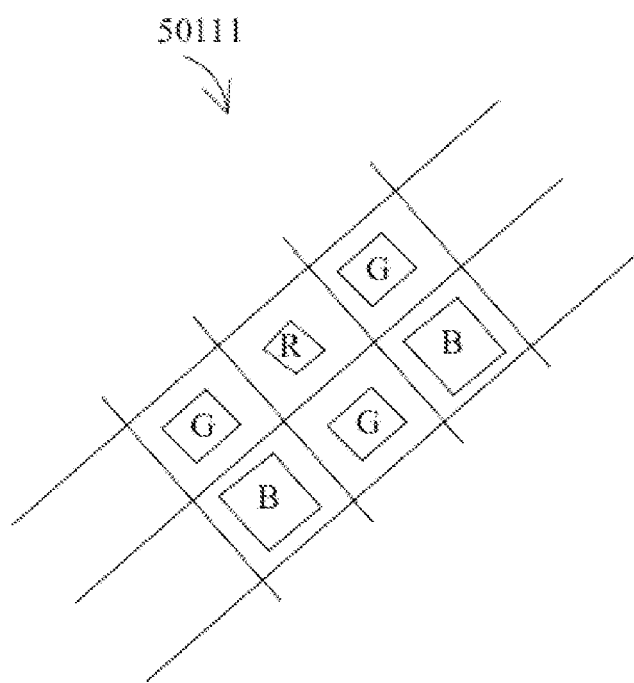
FIG. 8 is a schematic view of a first trunk strip surrounding two sub-pixels along a width direction of the first trunk strip.

As shown in FIG. 8, which is a schematic view of the first trunk strip surrounding two sub-pixels along the width direction of the first trunk strip, typically, a width of a metal line of the metal grid is 2 μm-4 μm, for example, 3 μm. The metal grid is diamond-shaped, and each metal grid surrounds one sub-pixel (one of a red sub-pixel R, a blue sub-pixel B, or a green sub-pixel G).

In the embodiment, one of the first trunk electrode 50111 or the second trunk electrode 50112 comprises a trunk non-widening portion and a trunk widening portion connected to the trunk non-widening portion. A width of the trunk widening portion is greater than a width of the trunk non-widening portion. The trunk widening portion is provided near an intersection of the first trunk electrode 50111 and the second trunk electrode 50112 to reduce a resistance of the first trunk electrode 50111 or the second trunk electrode 50112 near the intersection.

Specifically, the first trunk electrode 50111 comprises the trunk widening portion and the trunk non-widening portion connected to the trunk widening portion to reduce the resistance of the first trunk electrode 50111 near the intersection of the first trunk electrode 50111 and the second trunk electrode 50112, which is more conducive to a conduction of touch signals at the intersection.

The first trunk strip 501111 comprises a non-widening section 501111a and a widening section 501111b connected to the non-widening section 501111a. A width of the widening section 501111b is greater than or equal to a width of the non-widening section 501111a. The widening section 501111a is provided near the intersection of the first trunk electrode 50111 and the second trunk electrode 50121 to reduce a resistance of the first trunk electrode 50111 near an intersection and reduce an influence of the resistance on a transmission of touch signals at the intersection. The widening section 501111b of the first trunk strip 50111 is wavy, and the non-widening section 501111a of the first trunk strip 501111 is linear. The widening section 501111b of the first trunk strip 501111 is located at the trunk widening portion of the first trunk electrode 50111, and the non-widening section of the first trunk strip 50111 is located at the trunk non-widening portion of the first trunk electrode 50111.

The width of the first trunk electrode 50111 at the widening section 501111b corresponding to the first trunk strip 501111 is greater than the width of the first trunk electrode 50111 at the non-widening section 501111a of the first trunk strip 501111. The area of the first trunk hollow portion 50111a at the first trunk electrode 50111 corresponding to the widening section 501111b is greater than the area of the first trunk hollow portion 50111a at the first trunk electrode 50111 corresponding to the non-widening section 501111a.

In the embodiment, each first branch electrode 50112 comprises at least one first branch widening portion 501122, each second branch electrode 50122 comprises at least one second branch widening portion 501222, and the first branch widening portion 501122 on each first branch electrode 50112 and the second branch widening portion 501222 of the second branch electrode 50122 adjacent to the first branch electrode 50112 are engaged with each other (as shown in FIG. 5), which increase a boundary between the first branch electrode 50112 and the second branch electrode 50122, and increase an amount of capacitance signal change when the finger touches the touch.

Each first branch electrode 50112 comprises the first branch widening portion 501122 and the first branch non-widening portion 501123. The first branch non-widening portion 501123 is connected to the first branch widening portion 501122. A width of the first branch widening portion 501122 is greater than a width of the first branch non-widening portion 501123, and a hollow area of the first branch electrode at the first branch widening portion 501122 is greater than a hollow area of the first branch electrode at the first branch non-widening portion 501123. Each second branch electrode 50122 comprises the second branch widening portion 501222 and the second branch non-widening portion 501223. The second branch widening portion 501222 is connected to the second branch non-widening portion 501223. A width of the second branch widening portion 501222 is greater than a width of the second branch non-widening portion 501223, and a hollow area at the second branch widening portion 501222 is greater than a hollow area at the second branch non-widening portion 501223.

The first branch widening portion 501122 of the first branch electrode 50112 is disposed corresponding to the second branch non-widening portion 501223 of the second branch electrode 50122 adjacent to the first branch electrode 50112, the second branch widening portion 501222 of the second branch electrode 50122 is disposed corresponding to the first branch non-widening portion 501123 of the first branch electrode 50112, and thus to achieve mutual engagement between the first branch widening portion 501122 of the first branch electrode 50111 and the second branch widening portion 501222 of the second branch electrode 50122. The first branch widening portion 501122 and the second branch widening portion 501222 are both square. The first branch hollow portion 50112a and the second branch hollow portion 50122a at the first branch widening portion 501122 and the second branch widening portion 501222 are square.

Further, at least one first branch strip 501121 of the first branch electrode 50112 extending from the first trunk non-hollowed portion 50111b of the first trunk electrode 50111 is provided with the first branch widening portion 501121a. The first branch widening portion 501121a is connected to the first trunk non-hollowed portion 50111b to further electrically connect the first branch electrodes 50112 on the two opposite first trunk strips 501111a. At least one second branch strip 501221 of the second branch electrode 50122 extending from the second trunk non-hollowed portion 50121b of the second trunk electrode 50121 is provided with the second branch strip widening portion 501221a. The second branch strip widening portion 501221a is connected to the second trunk strip non-hollowed portion 50121b to further electrically connect the second branch electrodes on the two opposite second trunk strips. Shapes of the first branch strip widening portion 501121a and the second branch strip widening portion 501221a may be trapezoid, rectangular, triangular, and the like.

In the embodiment, in each touch unit, the mutual capacitance between the first electrode 5011 and the second electrode 5012 is greater than or equal to 0.1 picofarad and less than or equal to 2.0 picofarad, or greater than or equal to 0.3 picofarad and less than or equal to 1.5 picofarad, such as 0.4 picofarad, 0.6 picofarad, 0.8 picofarad, or 1.2 picofarad. When the mutual capacitance between the first electrode 5011 and the second electrode 5012 is too large, a change in capacitance between the first electrode 5011 and the second electrode 5012 is smaller than a rate of change in the mutual capacitance between the first electrode 5011 and the second electrode 5012, and if the mutual capacitance between the first electrode 5011 and the second electrode 5012 is too small, the touch capacitance signal will be small when touching.

Figure 9:
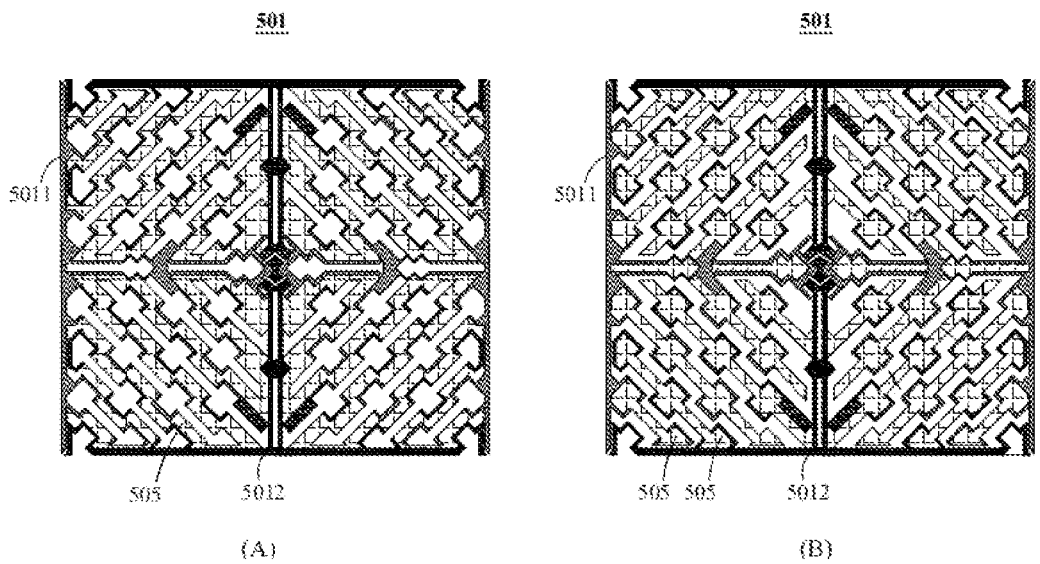
FIG. 9 is a second schematic view of the touch unit shown in FIG. 4.

Please refer to FIG. 9, which is a second schematic view of the touch unit shown in FIG. 4. The touch unit 501 further comprises a plurality of floating electrodes 505. The floating electrode 505 is electrically insulated from the first electrode 5011 and the second electrode 5012, and the floating electrode 505 is arranged in the hollow portion.

Specifically, as shown in FIG. 9(B), a portion of the floating electrode 505 is disposed in the first trunk hollow portion 50111a of the first trunk electrode 50111, a portion of the floating electrode 505 is disposed in the second trunk hollow portion 50121a of the second trunk electrode 50121, a portion of the floating electrode 505 is disposed in the first branch hollow portion 50112a of the first branch electrode 50112, and a portion of the floating electrode 505 is disposed in the second branch hollow portion 50122a of the second branch electrode 50122 to improve an optical consistency of light emitted by the organic light emitting diode array layer when passing through the touch layer.

In the embodiment, a portion of the floating electrode 505 is disposed between the first electrode 5011 and the second electrode 5012 to prevent short-circuiting of the first electrode 5011 and the second electrode 5012 during the manufacturing process, to reduce the parasitic capacitance between the first electrode 5011 and the second electrode 5012 and the common cathode, and improve the optical uniformity when the light passes through the touch layer.

Specifically, as shown in FIG. 9(A), the floating electrode 505 is provided between the first branch electrode 50112 and the second branch electrode 50122 adjacent to the first branch electrode 50112. The floating electrode 505 is electrically insulated from the first branch electrode 50112. The floating electrode 505 is electrically insulated from the second branch electrode 50122. The floating electrode 505 is disposed between the first branch electrode 50112 and the second branch electrode 50122 to prevent the first branch electrode 50112 and the second branch electrode 50122 from being provided with widening portions, a large-area occlusion may cause a short circuit between the first branch electrode 50112 and the second branch electrode 50122 during the production process, so as to prevent short circuit between the first electrode 5011 and the second electrode 5012. In addition, the floating electrode 505 between the first branch electrode 50112 and the second branch electrode 50122 also functions to reduce the parasitic capacitance between the first electrode 5011 and the second electrode 5012 and the common cathode and also maintains the optical uniformity of the light emitted by the organic light emitting diode array layer through the touch layer.

In the embodiment, the floating electrode 505 is provided in the same layer as the first electrode 5011 and the second electrode 5012. The first electrode 5011, the second electrode 5012, and the floating electrode 505 are all composed of metal grid. The floating electrode 505 is electrically insulated from the first electrode 5011 and the second electrode 5012 through a fracture of the metal grid.

As shown in FIG. 9(A), the floating electrode 505 is provided between the first branch electrode 50112 and the second vertical trunk electrode 50123, and the floating electrode 505 is also provided between the first branch electrode 50112 and the second trunk electrode 50121. The floating electrode 505 is provided between the second branch electrode 50122 and the first vertical trunk electrode 50113, and the floating electrode 505 is provided between the second branch electrode 50122 and the first trunk electrode 50111 to prevent short circuits.

Further, the number of sub-pixels surrounded by the floating electrode 505 disposed between the first electrode 5011 and the second electrode 5012 in the width direction of the floating electrode 505 is less than or equal to 4 and greater than 0. For example, the floating electrode 505 surrounds 0.5 sub-pixels, 2 sub-pixels, or 3 sub-pixels to prevent the floating electrode 505 from being too wide and the edge mutual capacitance between the first electrode 5011 and the second electrode 5012 being too small, which is not conducive to the amount of change caused when the finger touches, and the signal amount caused by the finger touch is too small.

In the embodiment, in each touch unit 501, a percentage of the ratio of the area of the floating electrode 505 to the area of the touch unit 501 is greater than or equal to 30% and less than or equal to 90%, for example, 35%, 40%, 50%, 60%, 70%, and 80%. The percentage of the ratio of the area of the floating electrode 505 to the area of the touch unit 501 is less than 30%, which will cause the parasitic self-capacitance between the first electrode 5011 of the single touch unit 501 and the cathode to be greater than 10 picofarads. The percentage of the ratio of the area of the floating electrode 505 to the area of the touch unit 501 is greater than 90%, which results in excessively small effective touch area and excessively small signal amount.

In the embodiment, in each touch unit 501, an absolute value of a difference between the percentage of the ratio of the area of the first electrode 5011 to the area of the touch unit 501 and the percentage of the ratio of the area of the second electrode 5012 to the area of the touch unit 501 is less than a preset percentage to ensure that the mutual capacitance formed by the interaction of the first electrode 5011 and the second electrode 5012 of the touch layer 50 is less than 0.5 picofarads. Specifically, the preset percentage is greater than 0 and less than or equal to 0.5%, for example, 0.2% or 0.3%.

Specifically, in each touch unit 501, the area of the first electrode 5011 is equal to the area of the second electrode 5012, so as to further maintain the mutual capacitance between the first electrode 5011 and the second electrode 5012 to meet the requirements. The area of the first electrode 5011 and the area of the second electrode 5012 are basically the same, and they are almost symmetrically disposed.

In the embodiment, the first electrode 5011 and the second electrode 5012 are disposed on a same conductive layer. The first electrodes 5011 in each touch unit are electrically connected by a bridge wire 504, and the second electrodes 5012 in each touch unit are continuously formed. Specifically, the two first sub-electrodes in the same touch unit 501 are electrically connected by the bridge wire 504, and the two second sub-electrodes in the same touch unit 502 are continuously formed. The bridge wire 504 is disposed on a different conductive layer from the first electrode 5011 and the second electrode 5012. The bridge wire can be an indium tin oxide layer or a metal grid. Specifically, the bridge wire 504 is composed of two V-shaped metal wires, and each V-shaped metal wire is composed of a metal grid.

Figure 10:
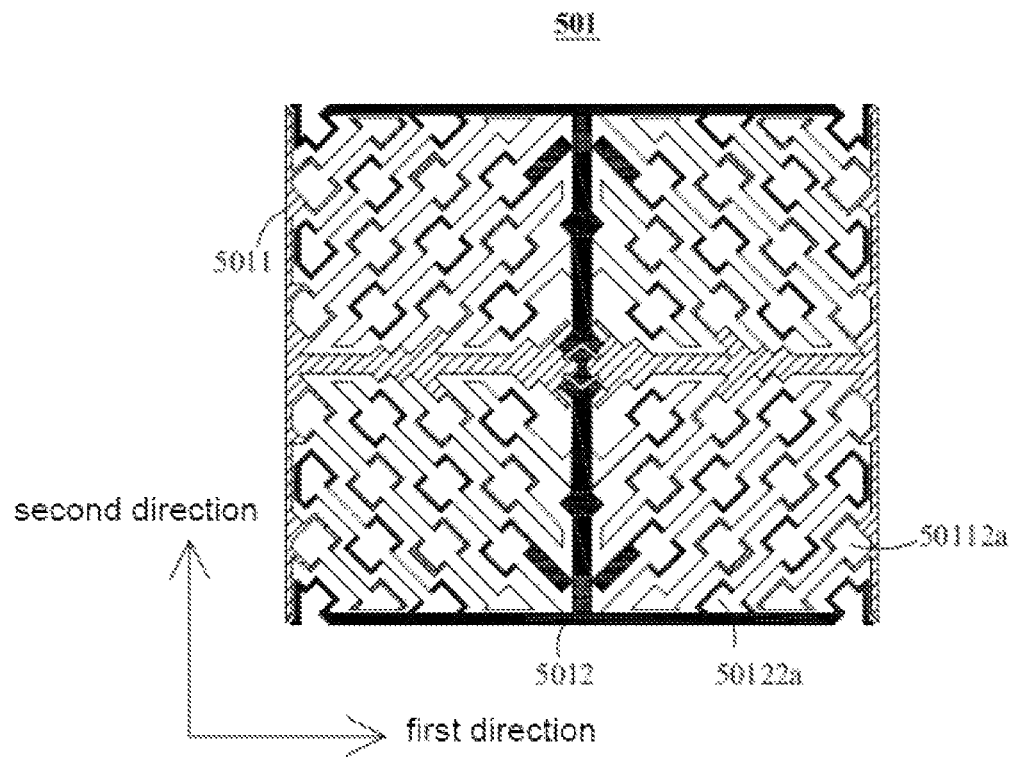
FIG. 10 is a third schematic view of the touch unit shown in FIG. 4.

As shown in FIG. 10, which is a third schematic view of the touch unit shown in FIG. 4, the touch unit shown in FIG. 10 is basically similar to the touch unit shown in FIG. 5, except that, in the touch unit 501 shown in FIG. 10, the first branch electrode 50112 is provided with the first branch hollow portion 50112a, the second branch electrode 50122 is provided with the second branch hollow portion 50122a, the first trunk electrode 50111 is not provided with the hollow portion, and the second trunk electrode 50121 is not provided with the hollow portion.

In other embodiments, the first trunk electrode 50111 may be provided with the first trunk hollow portion 50111a, the second trunk electrode 50121 may be provided with the second trunk hollow portion 50121a, and the first branch electrode 50112 and the second branch electrode 50122 may not be provided with the hollow portion.

In other embodiments, the first trunk electrode 50111 may be provided with the first trunk hollow portion 50111a, the first branch electrode 50112 may be provided with the first branch 50112a, and the second electrode 5012 may not be provided with the hollow portion.

In other embodiments, the second trunk electrode 50121 may be provided with the second trunk hollow portion 50121a, the second branch electrode 50122 may be provided with the second branch hollow portion 50122a, and the first electrode 5011 may not be provided with the hollow portion.

A design scheme of the touch unit pattern of the present invention can ensure the signal amount (greater than or equal to 60 fF) when the finger touches, prevents the touch electrode charging caused by the excessive delay of the resistance capacitance of the touch screen, and prevents the decrease of the touch screen induction frequency, thereby preventing the impact on key touch performance indicators such as a report rate.

The description of the above embodiments is only used to help understand the technical solutions and core ideas of the present invention. One of ordinary skill in the art should understand that they may still modify the technical solutions described in the preceding examples, or replace some of the technical features with equivalent ones, and that such modifications or replacements do not take the essence of the corresponding technical solutions out of the scope of the technical solutions of the embodiments of the present invention.

What is claimed is:

1. A touch component, comprising:
   a touch layer, wherein the touch layer comprises a plurality of touch units, and each of the touch units comprises:
   a first electrode disposed along a first direction, wherein the first electrode comprises a first trunk electrode extending in the first direction and at least one first branch electrode extending from the first trunk electrode; and
   a second electrode disposed along a second direction, wherein the second electrode is electrically insulated from the first electrode, the second electrode comprises a second trunk electrode extending along the second direction and at least one second branch electrode extending from the second trunk electrode, and at least part of the first branch electrode is crossed with at least part of the second branch electrode;
   wherein the first trunk electrode comprises a plurality of hollow portions disposed at intervals and distributed along the first direction, and a first trunk non-hollowed portion provided between two adjacent hollow portions; and the first branch electrode extends from the first trunk non-hollowed portion of the first trunk electrode; and
   the second trunk electrode comprises a plurality of the hollow portions disposed at intervals and distributed along the second direction, and a second trunk non-hollowed portion provided between two adjacent hollow portions; and the second branch electrode extends from the second trunk non-hollowed portion of the second trunk electrode;
   wherein the first branch electrode comprises a first branch widening portion and a first branch non-widening portion, and the second branch electrode comprises a second branch widening portion and a second branch non-widening portion, and
   the first branch widening portion of the first branch electrode is disposed corresponding to the second branch non-widening portion of the second branch electrode adjacent to the first branch electrode, and the second branch widening portion of the second branch electrode is disposed corresponding to the first branch non-widening portion of the first branch electrode.

2. The touch component as claimed in claim 1, wherein the first branch electrode is provided with the hollow portion, and the second branch electrode is provided with the hollow portion.

3. The touch component as claimed in claim 1, wherein the touch unit further comprises a floating electrode, a portion of the floating electrode is disposed between the first branch electrode and the second branch electrode adjacent to the first branch electrode, the floating electrode is electrically insulated from the first branch electrode, and the floating electrode is electrically insulated from the second branch electrode.

4. The touch component as claimed in claim 1, wherein each of the first branch electrodes comprises two opposite and connected first branch strips and the hollow portion disposed between the two opposite first branch strips; and
   each of the second branch electrodes comprises two opposite and connected second branch strips and the hollow portion disposed between the two opposite second branch strips.

5. The touch component as claimed in claim 1, wherein one of the first trunk electrode or the second trunk electrode comprises a trunk non-widening portion and a trunk widening portion connected to the trunk non-widening portion, a width of the trunk widening portion is greater than a width of the trunk non-widening portion, and the trunk widening portion is provided near an intersection of the first trunk electrode and the second trunk electrode.

6. The touch component as claimed in claim 1, wherein the touch unit further comprises a plurality of floating electrodes, the plurality of floating electrodes are electrically insulated from the first electrode and the second electrode, and a portion of the floating electrodes is disposed in the hollow portion.

7. The touch component as claimed in claim 6, wherein a portion of the floating electrodes is disposed between the first electrode and the second electrode.

8. The touch component as claimed in claim 6, wherein in each of the touch units, a percentage of a ratio of an area of the floating electrode to an area of the touch unit is greater than or equal to 30% and less than or equal to 90%.

9. The touch component as claimed in claim 1, wherein in each of the touch units, an absolute value of a difference between a percentage of a ratio of an area of the first electrode to an area of the touch unit and a percentage of a ratio of an area of the second electrode to an area of the touch unit is less than a preset percentage.

10. The touch component as claimed in claim 9, wherein in each of the touch units, the area of the first electrode is equal to the area of the second electrode.

11. The touch component as claimed in claim 1, wherein the first electrode and the second electrode are located on a same conductive layer, the first electrode in each of the touch units is electrically connected by a bridge wire, and the second electrode in each of the touch units is continuously formed.

12. The touch component as claimed in claim 1, wherein the first electrode further comprises a first vertical trunk electrode, the first vertical trunk electrode and the first trunk electrode are perpendicular to each other, and the first vertical trunk electrode is parallel to the second direction, and
   the second electrode further comprises a second vertical trunk electrode, the second vertical trunk electrode and the second trunk electrode are perpendicular to each other, the second vertical trunk electrode is parallel to the first direction, and the first direction is perpendicular to the second direction.

13. A touch display device, comprising:
the touch component as claimed in claim 1 and a display panel;
wherein the display panel comprises a plurality of sub-pixels, and the touch component is located on a light emitting side of the display panel.

14. The touch display device as claimed in claim 13, wherein each of the first branch electrodes surrounds at least two of the sub-pixels in a width direction of the first branch electrode, and each of the second branch electrodes surrounds at least two of the sub-pixels in a width direction of the second branch electrode; and
both the first electrode and the second electrode are composed of a metal grid.

15. The touch display device as claimed in claim 13, wherein the touch layer further comprises a plurality of floating electrodes, a portion of the floating electrodes is disposed between the first electrode and the second electrode, a number of the sub-pixels surrounded by the floating electrodes disposed between the first electrode and the second electrode in a width direction of the floating electrodes is less than or equal to 4 and greater than 0, and the floating electrodes are composed of a metal grid.

16. The touch display device as claimed in claim 13, wherein the display panel comprises an organic light emitting diode array layer and a packaging layer, and the packaging layer is located between the organic light emitting diode array layer and the touch component.

* * * * *